(12) United States Patent
Obara

(10) Patent No.: US 7,834,651 B2
(45) Date of Patent: Nov. 16, 2010

(54) POWER SUPPLY CIRCUIT

(75) Inventor: Kenji Obara, Tokyo (JP)

(73) Assignee: Advantest Corporation, Tokyo (JP)

( * ) Notice: Subject to any disclaimer, the term of this patent is extended or adjusted under 35 U.S.C. 154(b) by 157 days.

(21) Appl. No.: 12/058,767

(22) Filed: Mar. 31, 2008

(65) Prior Publication Data

US 2009/0179652 A1 Jul. 16, 2009

Related U.S. Application Data

(60) Provisional application No. 61/021,619, filed on Jan. 16, 2008.

(51) Int. Cl.
*G01R 31/26* (2006.01)
*G01R 31/36* (2006.01)
*H02M 3/335* (2006.01)

(52) U.S. Cl. .................. 324/771; 324/765; 324/158.1; 363/21.01; 363/21.08

(58) Field of Classification Search ................ 324/537, 324/771, 158.1; 363/21.01–21.08
See application file for complete search history.

(56) References Cited

U.S. PATENT DOCUMENTS 6,118,674 A * 9/2000 Higashi ..................... 363/71

7,486,059 B2 * 2/2009 Kodera ...................... 323/282
2007/0013409 A1 * 1/2007 Chae ......................... 324/771
2007/0296454 A1 * 12/2007 Koura ....................... 324/771

FOREIGN PATENT DOCUMENTS

| JP | 03-183967 | 8/1991 |
|---|---|---|
| JP | 09-043284 | 2/1997 |
| JP | 09-178820 | 7/1997 |
| JP | 2002-277505 | 9/2002 |
| JP | 2007-309859 | 11/2007 |

* cited by examiner

*Primary Examiner*—Ha Tran T Nguyen
*Assistant Examiner*—Emily Y Chan
(74) *Attorney, Agent, or Firm*—Osha Liang LLP

(57) ABSTRACT

Provided is a power supply circuit that supplies an electronic device with a supply power, including a voltage control section that outputs a control voltage that tracks an input voltage with a prescribed frequency characteristic and applies a voltage corresponding to the control voltage to the electronic device, a voltage adjusting section that detects the voltage applied to the electronic device and adjusts the input voltage based on the detected voltage, a current adjusting section that detects a current applied to the electronic device and adjusts the input voltage when the detected current is outside of a prescribed limit range, and a frequency characteristic adjusting section that increases a speed at which the control voltage tracks the input voltage by adjusting the frequency characteristic of the voltage control section when the applied current is outside of the limit range.

7 Claims, 7 Drawing Sheets

POWER SUPPLY CIRCUIT

CROSS REFERENCE TO RELATED APPLICATION

The present application claims priority from a U.S. Provisional Application No. 61/021,619 filed on Jan. 16, 2008, the contents of which are incorporated herein by reference.

BACKGROUND

1. Technical Field

The present invention relates to a power supply circuit and a test apparatus. In particular, the present invention relates to a power supply circuit that supplies power to an electronic device, such as a semiconductor circuit, and a test apparatus that tests an electronic device, such as a semiconductor circuit.

2. Related Art

Conventionally, a power supply circuit is mounted on a test apparatus that tests an electronic device to provide power to the electronic device. The power supply circuit may be provided with a current control function to prevent excessive current flow to the electronic device as in, for example, Japanese Patent Application Publication No. 2007-309859.

The circuit disclosed in FIG. 5 of the above Patent Application Publication detects the current flowing to the device under test by detecting the voltage at both ends of a current detection resistor provided at the output of a main amplifier. When the detected current is outside of a limit range determined by the settings of the DA converter, the power supply circuit controls the current flowing to the device under test to be within the limit range by controlling the voltage supplied to an input end of the main amplifier.

However, even when such a circuit controls the current flowing to the device under test to be within a prescribed range, excessive current that is outside of the limit range transiently flows to the device under test. For example, excessive current flows to the device under test while the circuit gradually changes the current to be within the limit range.

Because of this, a transient excessive current continuously flows to the device under test when a switch in the device under test is quickly turned on or off. When this happens, the circuitry in the device under test is undesirably stressed by heating due to the excessive current.

SUMMARY

Therefore, it is an object of an aspect of the innovations herein to provide a power supply circuit and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary power supply circuit may include a power supply circuit that supplies an electronic device with a supply power, including a voltage control section that outputs a control voltage tracking an input voltage with a prescribed frequency characteristic and applies a voltage corresponding to the control voltage to the electronic device, a voltage adjusting section that detects the voltage applied to the electronic device and adjusts the input voltage based on the detected voltage, a current adjusting section that detects a current applied to the electronic device and adjusts the input voltage when the detected current is outside of a prescribed limit range, and a frequency characteristic adjusting section that increases a speed at which the control voltage tracks the input voltage by adjusting the frequency characteristic of the voltage control section when the applied current is outside of the limit range.

According to a second aspect related to the innovations herein, one exemplary test apparatus may include a test apparatus that tests an electronic device, including a power supply circuit that supplies power for driving the electronic device and a judging section that judges pass/fail of the electronic device based on a state of the electronic device while driven. In the test apparatus, the power supply circuit includes a voltage control section that outputs a control voltage that tracks an input voltage with a prescribed frequency characteristic and applies a voltage corresponding to the control voltage to the electronic device, a voltage adjusting section that detects the voltage applied to the electronic device and adjusts the input voltage based on the detected voltage, a current adjusting section that detects a current applied to the electronic device and adjusts the input voltage when the detected current is outside of a prescribed limit range, and a frequency characteristic adjusting section that increases a speed at which the control voltage tracks the input voltage by adjusting the frequency characteristic of the voltage control section when the applied current is outside of the limit range.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
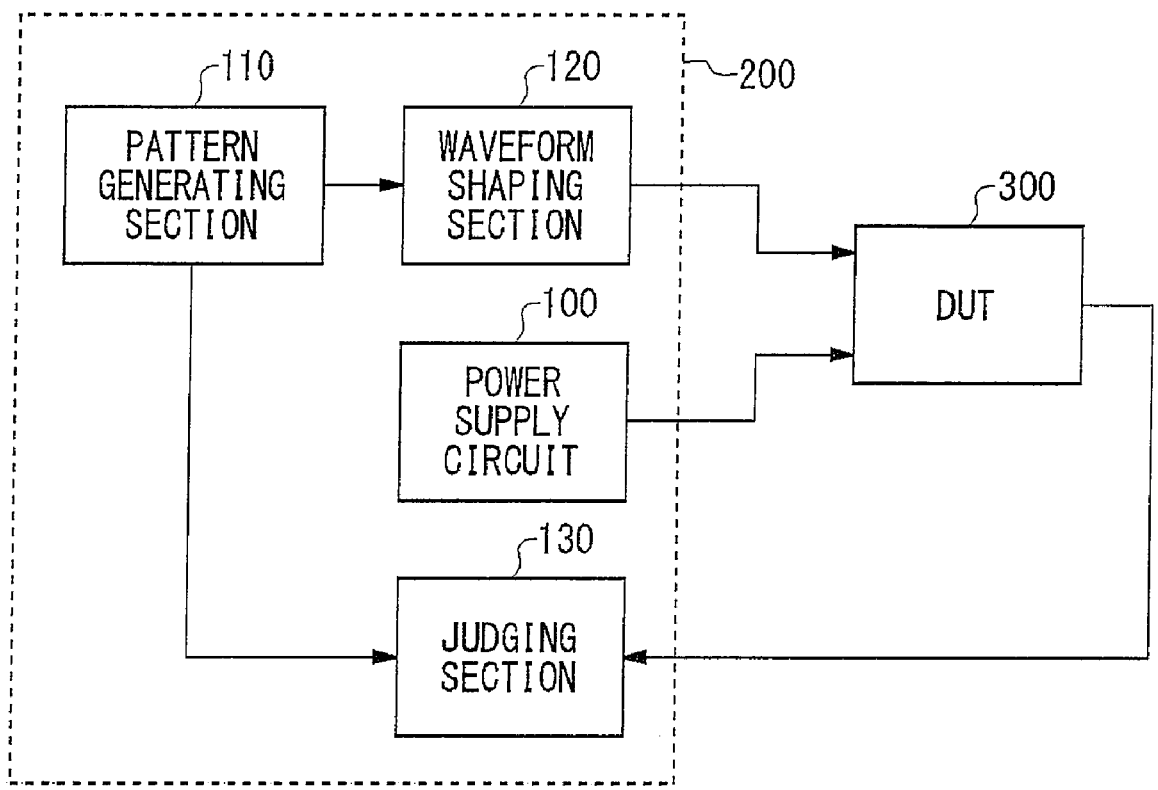
FIG. 1 shows an exemplary configuration of a test apparatus 200 according to the present embodiment.

FIG. 1 shows an exemplary configuration of a test apparatus 200 according to the present embodiment. The test apparatus 200 tests an electronic device 300 such as a semiconductor circuit and is provided with a pattern generating section 110, a waveform shaping section 120, a judging section 130, and a power supply circuit 100.

The pattern generating section 110 generates a test pattern to be supplied to the electronic device 300, based on a test program provided by a user and the like. For example, the pattern generating section 110 generates a pattern indicating, with an arrangement of data values of one and zero, a signal that is supplied to the electronic device 300, and a pattern indicating a timing at which the signal corresponding to these data values is supplied to the electronic device 300.

The waveform shaping section 120 generates the test signal supplied to the electronic device 300, based on the test pattern generated by the pattern generating section 110. The power supply circuit 100 supplies the supply power to drive the electronic device 300.

The judging section 130 judges pass/fail of the electronic device 300 based on the state of the electronic device 300 during driving. For example, the judging section 130 judges pass/fail of the electronic device 300 by comparing the output signal of the electronic device 300 to an expected signal generated by the pattern generating section 110. The test apparatus 200 of the present embodiment judges pass/fail based on the output signal, but other exemplary test apparatuses may detect the applied current supplied from the power supply circuit 100 to the electronic device 300 and judge pass/fail based on this applied current.

Figure 2:
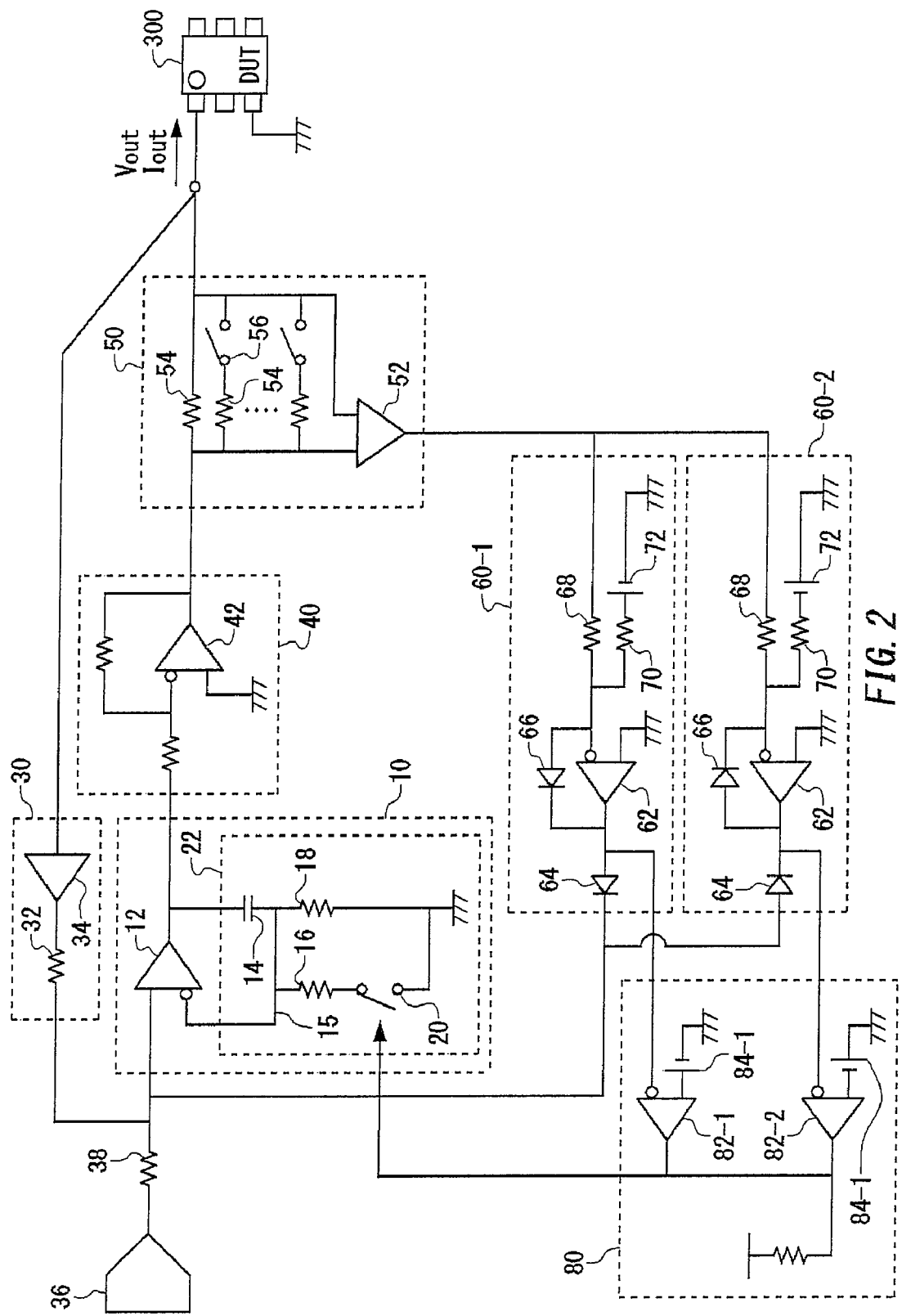
FIG. 2 shows an exemplary configuration of the power supply circuit 100 together with the electronic device 300.

FIG. 2 shows an exemplary configuration of the power supply circuit 100 together with the electronic device 300. The power supply circuit 100 of the present embodiment is provided with a voltage setting section 36, a input resistor 38, a voltage control section 10, a voltage adjusting section 30, a voltage amplifying section 40, a current detecting section 50, a current adjusting section 60, and a frequency characteristic adjusting section 80.

The voltage setting section 36 generates an input voltage having a set voltage value. For example, the voltage setting section 36 is a DA converter that converts set digital data into an analog voltage. The voltage setting section 36 supplies the voltage control section 10 with the generated input voltage via the input resistor 38.

The voltage control section 10 outputs a control voltage that tracks a change in the supplied input voltage with a prescribed frequency characteristic. For example, the voltage control section 10 is a negative feedback circuit that feeds the output voltage back to a negative input via a feedback circuit having the prescribed frequency characteristic. The voltage control section 10 applies a voltage corresponding to the control voltage to the electronic device 300 by supplying the control voltage to the electronic device 300 via the voltage amplifying section 40.

The voltage adjusting section 30 detects the voltage applied to the electronic device 300. The voltage adjusting section 30 adjusts the input voltage supplied to the voltage control section 10, based on the detected applied voltage. For example, the voltage adjusting section 30 superimposes a voltage corresponding to the detected applied voltage onto the input voltage supplied to the voltage control section 10. With such a configuration, the power supply circuit 100 can restrict the change in the voltage applied to the electronic device 300.

The voltage amplifying section 40 amplifies the control voltage output by the voltage control section 10 and supplies the electronic device 300 with this amplified voltage. The current detecting section 50 detects the current supplied from the voltage amplifying section 40 to the electronic device 300.

The current adjusting section 60 detects the applied current supplied to the electronic device 300 via the current detecting section 50. When this applied current is outside of a prescribed limit range, the current adjusting section 60 adjusts the voltage input to the voltage control section 10. For example, when the applied current exceeds a prescribed upper limit, the current adjusting section 60 decreases the voltage input to the voltage control section 10. By doing this, the current adjusting section 60 prevents excessive current from flowing to the electronic device 300.

When the current applied to the electronic device 300 is outside of the limit range of the current adjusting section 60, the frequency characteristic adjusting section 80 increases the speed at which the output voltage, namely the control voltage, tracks the input voltage of the voltage control section 10. More specifically, when the current adjusting section 60 adjusts the input voltage of the voltage control section 10, the frequency characteristic adjusting section 80 increases the tracking speed of the voltage control section 10. The frequency characteristic adjusting section 80 may increase this tracking speed by adjusting the frequency characteristic of the voltage control section 10.

Through the control described above, the frequency characteristic adjusting section 80 can shorten the time period from when an excessive transitive current begins to flow to the electronic device 300 to when the voltage applied to the electronic device 300 is controlled. In this way, the power supply circuit 100 can decrease the stress on the electronic device 300 caused by the excessive current.

The following is a detailed example of the control of the voltage control section 10 by the frequency characteristic adjusting section 80. The voltage control section 10 of the present embodiment has a control voltage output section 12 and a feedback section 22. The control voltage output section 12 receives the input voltage at a first input terminal. The control voltage output section 12 outputs the control voltage from an output terminal based on voltages received at the first input terminal and a second input terminal. For example, the control voltage output section 12 is a differential amplifier that outputs a control voltage corresponding to a difference between the voltage received at the first input terminal and the voltage received at the second input terminal.

The feedback section 22 feeds the control voltage output by the control voltage output section 12 back to the second input terminal. The second input terminal of the control voltage output section 12 may be a negative input terminal. The feedback section 22 of the present embodiment has a feedback circuit 15, a capacitor section, and a resistance section. The capacitor section of the present embodiment has a capacitor 14. The resistance section of the present embodiment has a first resistor 18, a second resistor 16, and a switching section 20.

The feedback circuit 15 electrically connects the output terminal of the control voltage output section 12 to the second input terminal of the control voltage output section 12. The feedback circuit 15 may be wiring provided between the output terminal of the control voltage output section 12 and the second input terminal of the control voltage output section 12.

The capacitor 14 provided on the feedback circuit 15 serially with the output terminal and the second input terminal of the control voltage output section 12. The resistance section, which includes the first resistor 18, the second resistor 16, and the switching section 20, is provided between the feedback circuit 15 and a ground potential.

More specifically, the first resistor 18 is provided between the feedback circuit 15 and the ground potential. The second resistor 16 is provided in parallel with the first resistor 18 between the feedback circuit 15 and the ground potential. The switching section 20 switches whether the second resistor 16 is connected in parallel with the first resistor 18. The switching section 20 may be a switch provided between the second resistor 16 and the ground potential.

By adopting the configuration described above, the feedback section 22 functions as a low-pass filter having a frequency characteristic corresponding to the resistance of the resistance section. Therefore, the frequency characteristic of the voltage control section 10 can be adjusted by adjusting the resistance of the resistance section.

When the applied current detected by the current detecting section 50 is within the limit range of the current adjusting section 60, the frequency characteristic adjusting section 80 controls the switching section 20 to separate the second resistor 16 from the first resistor 18. When the applied current detected by the current detecting section 50 is outside of the limit range of the current adjusting section 60, the frequency characteristic adjusting section 80 controls the switching section 20 to connect the second resistor 16 in parallel with the first resistor 18.

Through the control described above, the resistance of the resistance section in the voltage control section 10 is made relatively small when an excessive current flows to the electronic device 300, thereby increasing the tracking speed of the voltage control section 10. The resistance of the resistance section in the voltage control section 10 is made relatively large when an excessive current is not flowing to the electronic device 300, thereby preventing oscillation of the voltage control section 10.

The resistance of the resistance section of the voltage control section 10 in the present embodiment can be switched between two values, but this resistance may be changeable between several different values or may be able to continuously change. In these cases, the frequency characteristic adjusting section 80 may select the resistance of the resistance section according to the difference between the applied current detected by the current detecting section 50 and the prescribed limit values.

The following is a description of an exemplary configuration of the voltage adjusting section 30 and the like, and these configurations may include other known configurations that have the same functions. The voltage adjusting section 30 of the present embodiment has a buffer 34 and a resistor 32. The buffer 34 has a sufficiently large input impedance and applies a voltage corresponding to the received applied voltage to the first input terminal of the control voltage output section 12 via the resistor 32. By adopting such a configuration, the voltage adjusting section 30 can restrict the change in the voltage applied to the electronic device 300.

The voltage amplifying section 40 of the present embodiment may have an amplifier circuit 42 that receives the control voltage output by the voltage control section 10 and amplifies this received voltage. The amplifier circuit 42 may be an inverting amplifier, as shown in FIG. 2.

The current detecting section 50 of the present embodiment has a current detection resistor 54 and a detection circuit 52. The current detection resistor 54 is serially connected between the output terminal of the voltage amplifying section 40 and the input terminal of the electronic device 300. The detection circuit 52 detects a voltage difference between the ends of the current detection resistor 54 to be the value of the current applied to the electronic device 300.

The current detecting section 50 may include a plurality of current detection resistors 54 provided in parallel and having different resistances. The current detecting section 50 may also have switches 56 that switch which of the current detection resistors 54 is serially connected between the voltage amplifying section 40 and the electronic device 300. The switches 56 may select a current detection resistor 54 based on the applied current to be supplied to the electronic device 300 in a stable state and may connect the selected current detection resistor 54 serially between the voltage amplifying section 40 and the electronic device 300.

The power supply circuit 100 of the present embodiment is provided with an L-side current adjusting section 60-1 and an H-side current adjusting section 60-2. When the applied current detected by the current detecting section 50 is less than a prescribed lower limit, the current adjusting section 60-1 supplies the input resistor 38 with an adjustment current to increase the input voltage supplied to the voltage control section 10. When the applied current detected by the current detecting section 50 is greater than a prescribed upper limit, the current adjusting section 60-2 supplies the input resistor 38 with an adjustment current to decrease the input voltage supplied to the voltage control section 10.

Each current adjusting section 60 has a differential amplifier 62, an output diode 64, a bias diode 66, a resistor 68, a resistor 70, and a control voltage output section 72. The control voltage output section 72 outputs a limit voltage corresponding to either the upper limit or the lower limit of the applied current.

The resistor 68 and the resistor 70 generate a voltage obtained by dividing the limit voltage and the voltage detected by the current detecting section 50 by a prescribed ratio. The differential amplifier 62 receives this divided voltage output by the divider circuit, including the resistor 68 and the resistor 70, at the negative input terminal, and the positive input terminal of the differential amplifier 62 is connected to the ground potential.

The output terminal of the differential amplifier 62 is connected to the output diode 64. The bias diode 66 is provided between the negative input terminal and the output terminal of the differential amplifier 62.

In the L-side current adjusting section 60-1, the output diode 64 is in a direction of the input resistor 38 from the differential amplifier 62 and the bias diode 66 is provided in a direction of the output terminal from the negative input terminal of the differential amplifier 62. By adopting such a configuration, the output diode 64 of the L-side current adjusting section 60-1 is turned on to increase the input voltage of the voltage control section 10 when the voltage detected by the current detecting section 50 is less than the limit voltage, indicating the lower limit, output by the control voltage output section 72.

In the H-side current adjusting section 60-2, the output diode 64 is in a direction opposite the input resistor 38 from the differential amplifier 62 and the bias diode 66 is provided in a direction opposite the output terminal from the negative input terminal of the differential amplifier 62. By adopting such a configuration, the output diode 64 of the H-side current adjusting section 60-1 is turned on to decrease the input voltage of the voltage control section 10 when the voltage detected by the current detecting section 50 is greater than the limit voltage, indicating the upper limit, output by the control voltage output section 72.

As described above, when the voltage detected by the current detecting section 50, i.e. the applied current, is outside of the limit range of the current adjusting section 60, the frequency characteristic adjusting section 80 adjusts the characteristic of the feedback section 22 to reduce the time constant of the feedback section 22. More specifically, the frequency characteristic adjusting section 80 turns on the switching section 20 when the L-side current adjusting section 60-1 or the H-side current adjusting section 60-2 generates the adjustment current.

The frequency characteristic adjusting section 80 of the present embodiment has an L-side adjusting circuit 82-1, an H-side adjusting circuit 82-2, an L-side bias power supply

84-1, and an H-side bias power supply 84-2. The L-side adjusting circuit 82-1 turns on the switching section 20 when the anode voltage of the output diode 64 in the L-side current adjusting section 60-1 is greater than the forward voltage of the output diode 64 by an amount greater than or equal to a prescribed reference voltage.

The L-side adjusting circuit 82-1 may be a differential circuit. The L-side adjusting circuit 82-1 has a negative input terminal connected to an anode of the output diode 64 and a positive input terminal connected to the L-side bias power supply 84-1. The bias power supply 84-1 generates a negative bias voltage, which is negative in relation to the prescribed reference voltage, corresponding to the forward voltage of the output diode 64 and supplies this bias voltage to the L-side adjusting circuit 82-1. By adopting this configuration, the L-side adjusting circuit 82-1 can increase the tracking speed of the voltage control section 10 when the L-side current adjusting section 60-1 outputs the adjustment current.

The H-side adjusting circuit 82-2 turns on the switching section 20 when the anode voltage of the output diode 64 in the H-side current adjusting section 60-2 is less than the forward voltage of the output diode 64 by an amount greater than or equal to a prescribed reference voltage.

The H-side adjusting circuit 82-2 may be a differential circuit. The H-side adjusting circuit 82-2 has a negative input terminal connected to an anode of the output diode 64 and a positive input terminal connected to the H-side bias power supply 84-2. The bias power supply 84-2 generates a positive bias voltage, which is positive in relation to the prescribed reference voltage, corresponding to the forward voltage of the output diode 64, and supplies this positive bias voltage to the H-side adjusting circuit 82-2. By adopting this configuration, the H-side adjusting circuit 82-2 can increase the tracking speed of the voltage control section 10 when the H-side current adjusting section 60-2 draws the adjustment current.

With the configuration described above, the power supply circuit 100 can increase the tracking speed of the voltage control section 10 when the current applied to the electronic device 300 is outside of the prescribed limit range. Therefore, the power supply circuit 100 can shorten the time period during which the excessive current flows to the electronic device 300, thereby protecting the electronic device 300.

Figure 3:
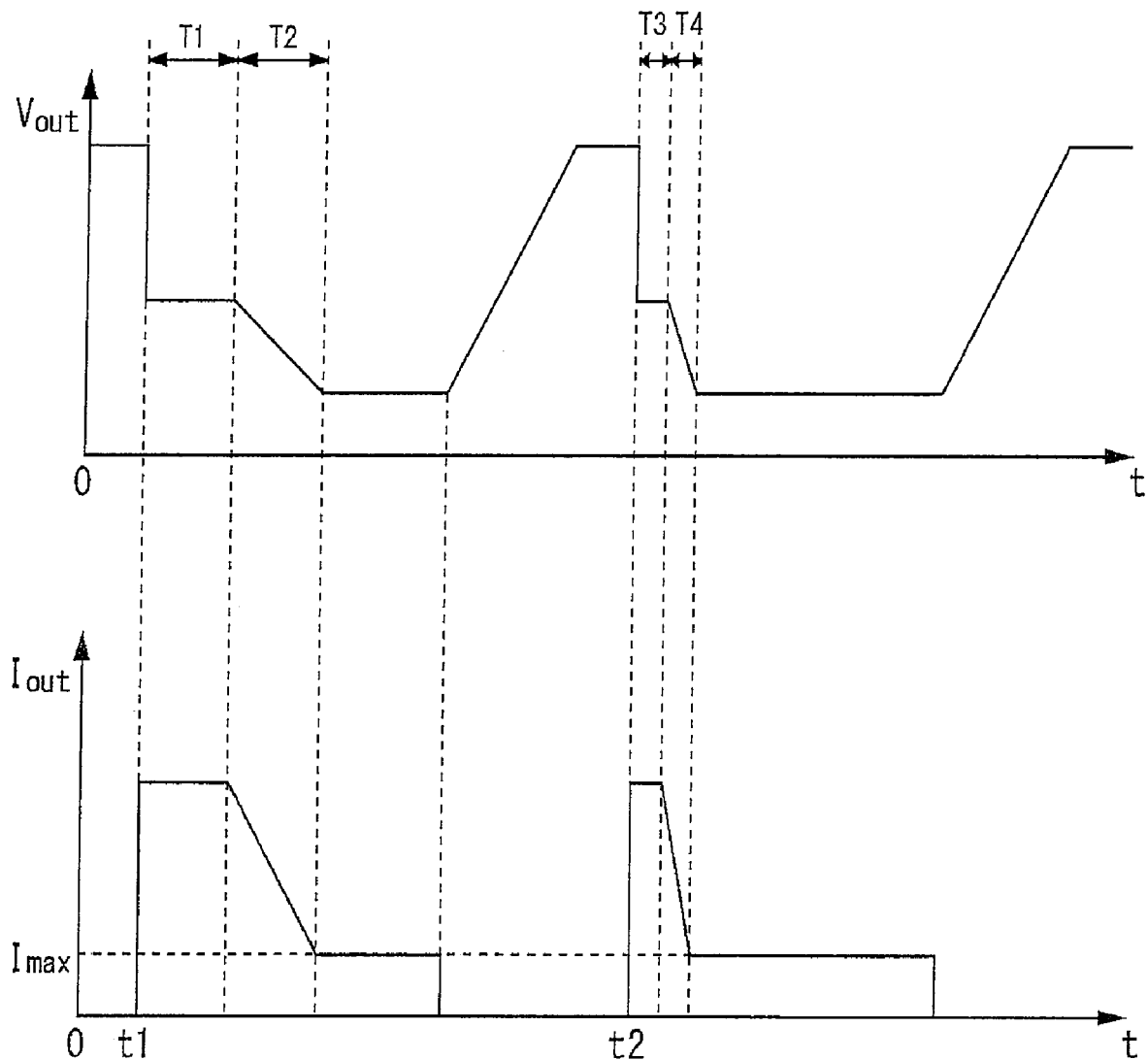
FIG. 3 is a timing chart describing an exemplary operation of the power supply circuit 100.

FIG. 3 is a timing chart describing an exemplary operation of the power supply circuit 100. The operation of the power supply circuit 100 of the present embodiment is described using the waveforms of the applied current Iout and the applied voltage Vout output by the power supply circuit 100. Imax represents the upper limit of the limit range of the current adjusting section 60. In the present embodiment, the electronic device 300 has a switch element provided between the output end of the power supply circuit 100 and the ground potential.

First, a case is described in which the frequency characteristic adjusting section 80 does not control the tracking speed of the voltage control section 10. The switch element and the like of the electronic device 300 is turned on at time t1, so that the applied current flows from the power supply circuit 100 to the electronic device 300 and the voltage output by the power supply circuit 100 drops because of the current detection resistor 54 and the like.

When the current adjusting section 60 detects that the applied current Iout is greater than the upper limit Imax, the current adjusting section 60 decreases the input voltage of the voltage control section 10 to restrict the applied current Iout. The voltage control section 10 decreases the output control voltage to track the change in the input voltage. However, the frequency characteristic of the feedback section 22 causes a delay in the change of the control voltage, which delays the changes in the applied voltage Vout and the applied current Iout by a time period T1. Furthermore, a time period of T2 elapses from when the applied current Iout begins to change to when the applied current Iout falls within the prescribed limit range.

In contrast to the above, the following is a description where the frequency characteristic adjusting section 80 controls the tracking speed of the voltage control section 10. The switch element and the like of the electronic device 300 is turned on at time t2, so that the applied current flows from the power supply circuit 100 to the electronic device 300 in the same manner as above.

When the current adjusting section 60 detects that the applied current Iout is greater than the upper limit Imax, the current adjusting section 60 decreases the input voltage of the voltage control section 10 to restrict the applied current Iout. At this time, the frequency characteristic adjusting section 80 reduces the time constant of the feedback section 22 by turning on the switching section 20 of the voltage control section 10.

Because of the lower time constant, the control voltage begins to change with a delay that is shorter than the delay in a case where the frequency characteristic adjusting section 80 does not control the tracking speed of the voltage control section 10. Therefore, the change in the applied voltage Vout and the applied current Iout begins after a delay of a time period T3, which is shorter than the time period T1. Furthermore, a time period T4 from when the applied current Iout begins to change to when the applied current Iout falls within the prescribed limit range is shorter than the time period T2.

As shown in FIG. 3, these shorter time periods result in a shorter time period during which the excessive current is supplied to the electronic device 300, thereby protecting the electronic device 300.

In the examples shown in FIGS. 1 to 3, the frequency characteristic adjusting section 80 reduces the time constant of the feedback section 22 by reducing the resistance of the resistance section in the feedback section 22. In other examples, the frequency characteristic adjusting section 80 may reduce the time constant of the feedback section 22 by reducing at least one of the resistance of the resistance section and the capacitance of the capacitor section in the feedback section 22.

Figure 4:
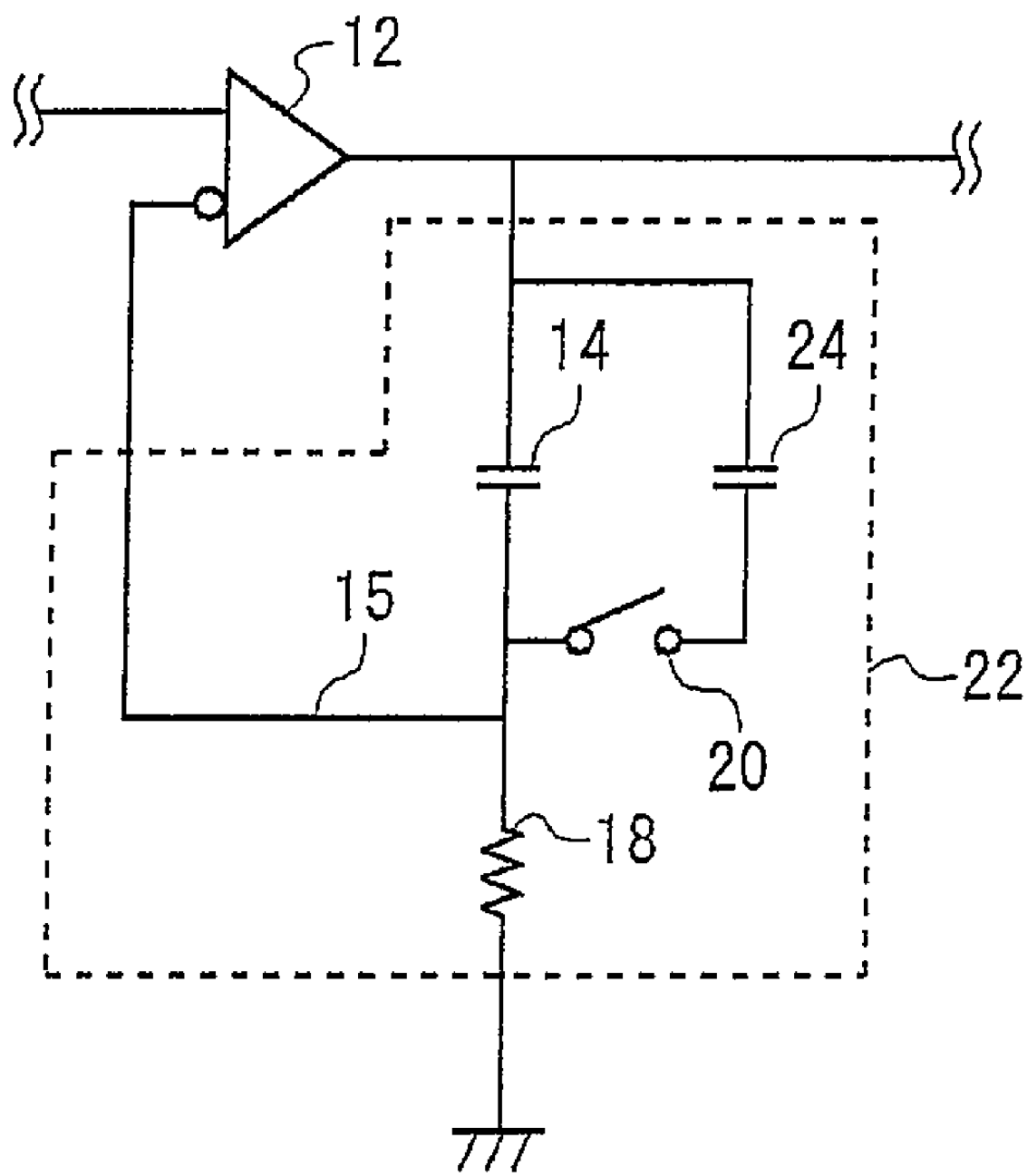
FIG. 4 shows another exemplary configuration of the voltage control section 10.

FIG. 4 shows another exemplary configuration of the voltage control section 10. The voltage control section 10 of the present embodiment includes a capacitor section that has a plurality of capacitors. The first capacitor 14 of the capacitor section is provided on the feedback circuit 15. A second capacitor 24 is provided in parallel with the first capacitor 14. The switching section 20 switches whether the second capacitor 24 is connected in parallel with the first capacitor 14.

When the current applied to the electronic device 300 is outside of the limit range of the current adjusting section 60, the frequency characteristic adjusting section 80 described in relation to FIG. 2 controls the switching section 20 to separate the second capacitor 24 from the first capacitor 14. When the current applied to the electronic device 300 is within the limit range of the current adjusting section 60, the frequency characteristic adjusting section 80 described in relation to FIG. 2 controls the switching section 20 to connect the second capacitor 24 in parallel with the first capacitor 14. By adopting this configuration, the frequency characteristic adjusting section 80 can adjust the capacitance of the capacitor section to adjust the time constant of the feedback section 22. The test apparatus 200 may be further provided with a discharging section that discharges the charge accumulated in the second capacitor 24 to a ground potential and the like when testing of the electronic device 300 is finished.

Figure 5:
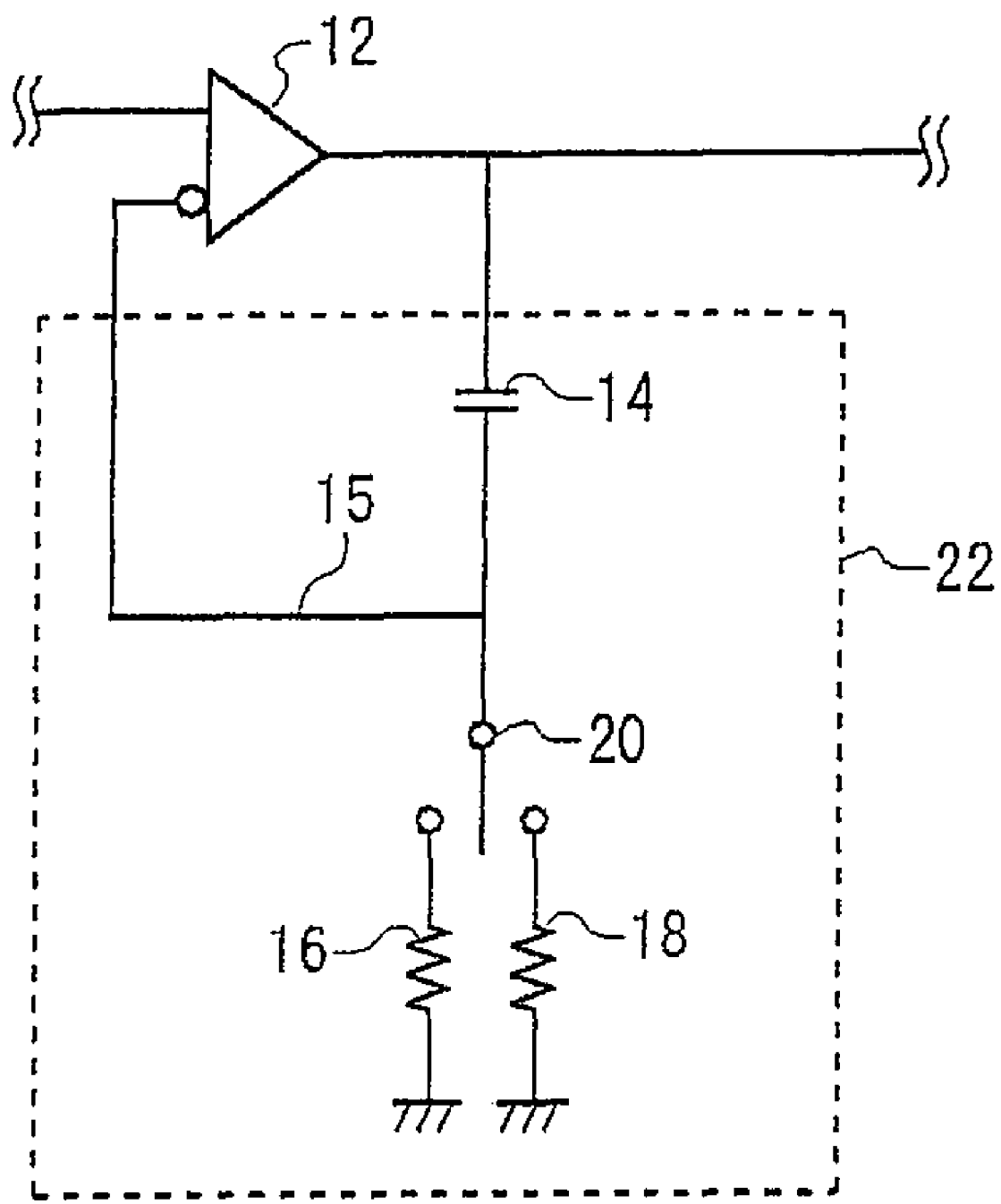
FIG. 5 shows another exemplary configuration of the voltage control section 10.

FIG. 5 shows another exemplary configuration of the voltage control section 10. The first resistor 18, the second resistor 16 and the switching section 20 of the voltage control section 10 of the present embodiment have functions that are different from those of the first resistor 18, the second resistor 16 and the switching section 20 of the voltage control section 10 described in relation to FIG. 2. The second resistor 16 of the present embodiment is provided in parallel with the first resistor 18 between the feedback circuit 15 and the ground potential, and has a greater resistance than the first resistor 18.

The switching section 20 of the present embodiment switches whether the first resistor 18 or the second resistor connects the feedback circuit 15 to the ground potential. When the current applied to the electronic device 300 is outside of the limit range of the current adjusting section 60, the frequency characteristic adjusting section 80 connects the feedback circuit 15 to the ground potential with the second resistor 16. When the applied current is within the limit range, the frequency characteristic adjusting section 80 connects the feedback circuit 15 to the ground potential with the first resistor 18.

With this configuration as well, the frequency characteristic adjusting section 80 can reduce the time constant of the feedback section 22. There are two resistors in the resistance section of the present embodiment, but in other examples the feedback section 22 may have three or more concurrent resistors, each having different resistances, as the resistance section. The switching section 20 may select which resistor connects the feedback circuit 15 to the ground potential. By adopting this configuration, the time constant of the feedback section 22 can be controlled to be a variety of values.

Figure 6:
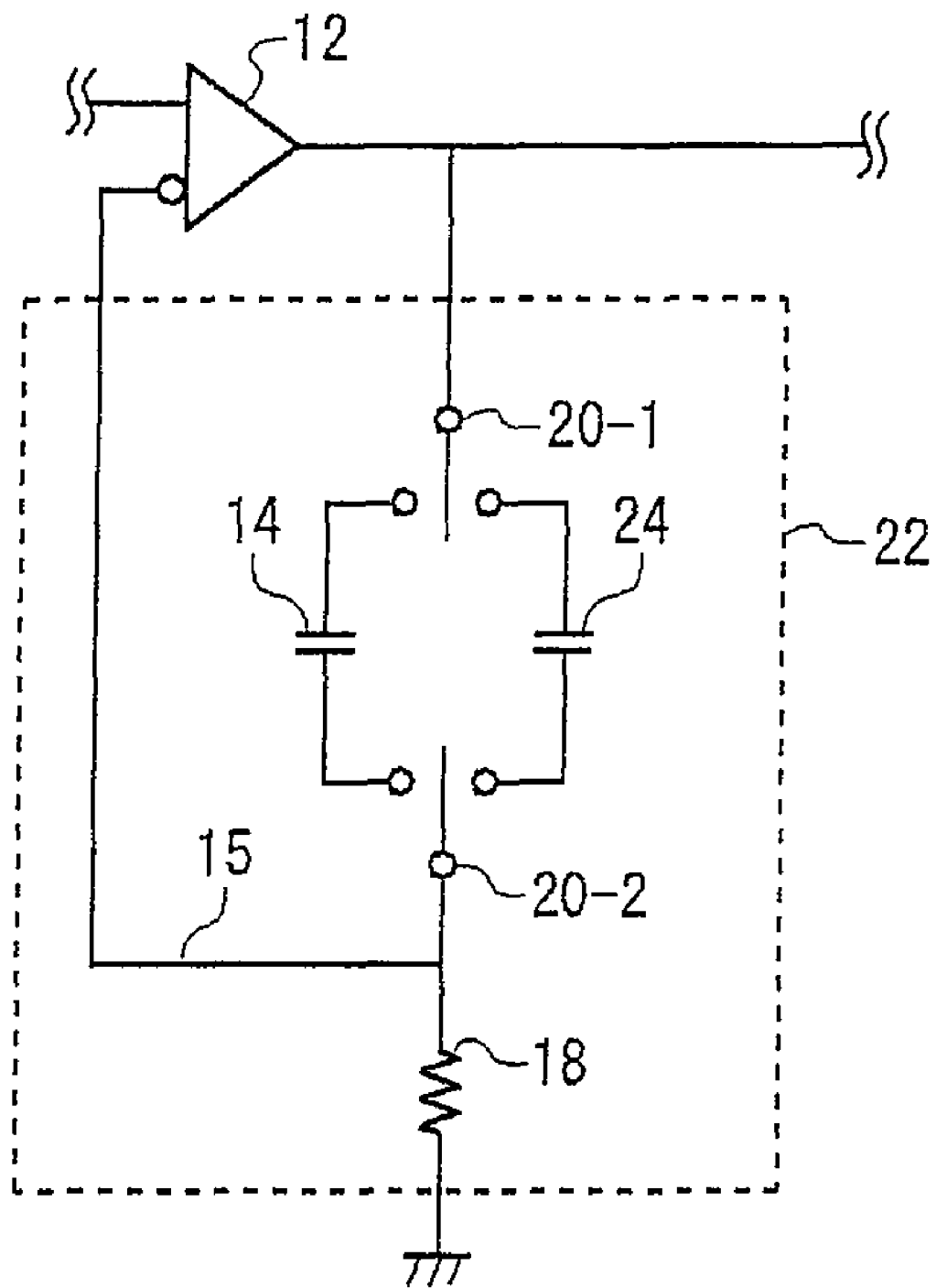
FIG. 6 shows another exemplary configuration of the voltage control section 10.

FIG. 6 shows another exemplary configuration of the voltage control section 10. The first capacitor 14, the second capacitor 24, and the switching section 20 of the voltage control section 10 of the present embodiment have functions that are different than those of the first capacitor 14, the second capacitor 24, and the switching section 20 of the voltage control section 10 described in relation to FIG. 4. The second capacitor 24 of the present embodiment is provided in parallel with the first capacitor 14 on the feedback circuit 15 and has a capacitance greater than that of the first capacitor 14.

The switching section 20 of the present embodiment switches whether the first capacitor 14 or the second capacitor 24 is on the feedback circuit 15. When the current applied to the electronic device 300 is outside of the limit range of the current adjusting section 60, the frequency characteristic adjusting section 80 connects the second capacitor 24 between the output terminal of the control voltage output section 12 and the second input terminal, which is the negative input terminal, of the control voltage output section 12. When the current applied to the electronic device 300 is within the limit range, the frequency characteristic adjusting section 80 connects the first capacitor 14 between the output terminal of the control voltage output section 12 and the second input terminal, which is the negative input terminal, of the control voltage output section 12. With this configuration as well, the time constant of the feedback section 22 can be reduced.

In the above examples, the power supply circuit 100 controls the tracking speed of a single voltage control section 10 by controlling the time constant of the voltage control section 10, but as another example, the power supply circuit 100 may be provided with concurrent voltage control sections 10 having different time constants. In this case, the frequency characteristic adjusting section 80 may select which voltage control section 10 is connected to the voltage amplifying section 40.

The tracking speed of the voltage amplifying section 40 may be faster than the tracking speed of the voltage control section 10 when the frequency characteristic adjusting section 80 does not adjust the frequency characteristic, e.g. the voltage control section 10 of FIG. 2 in which the switching section 20 is turned off. At this time the tracking speed of a system including the voltage control section 10 and the voltage amplifying section 40 only increases up to the tracking speed of the voltage amplifying section 40, even if the tracking speed of the voltage control section 10 exceeds that of the voltage amplifying section 40.

Therefore, when the current applied to the electronic device 300 is outside of the limit range, the frequency characteristic adjusting section 80 may adjust the tracking speed of the voltage control section 10 to be substantially equal to the tracking speed of the voltage amplifying section 40. The voltage control section 10 may include the second resistor 16 or the second capacitor 24 to adjust the tracking speed of the voltage control section 10 to be substantially equal to the tracking speed of the voltage amplifying section 40.

When the current applied to the electronic device 300 is outside of the limit range, the frequency characteristic adjusting section 80 may adjust the tracking speed of the voltage amplifying section by adjusting the frequency characteristic of the voltage amplifying section. At this time, the frequency characteristic adjusting section 80 may adjust the tracking speed of the voltage control section 10 to be substantially equal to the tracking speed of the voltage amplifying section 40 after the frequency characteristic of the voltage amplifying section 40 has been adjusted. By doing this, the tracking speed of the system including the voltage control section 10 and the voltage amplifying section 40 can be increased.

Figure 7:
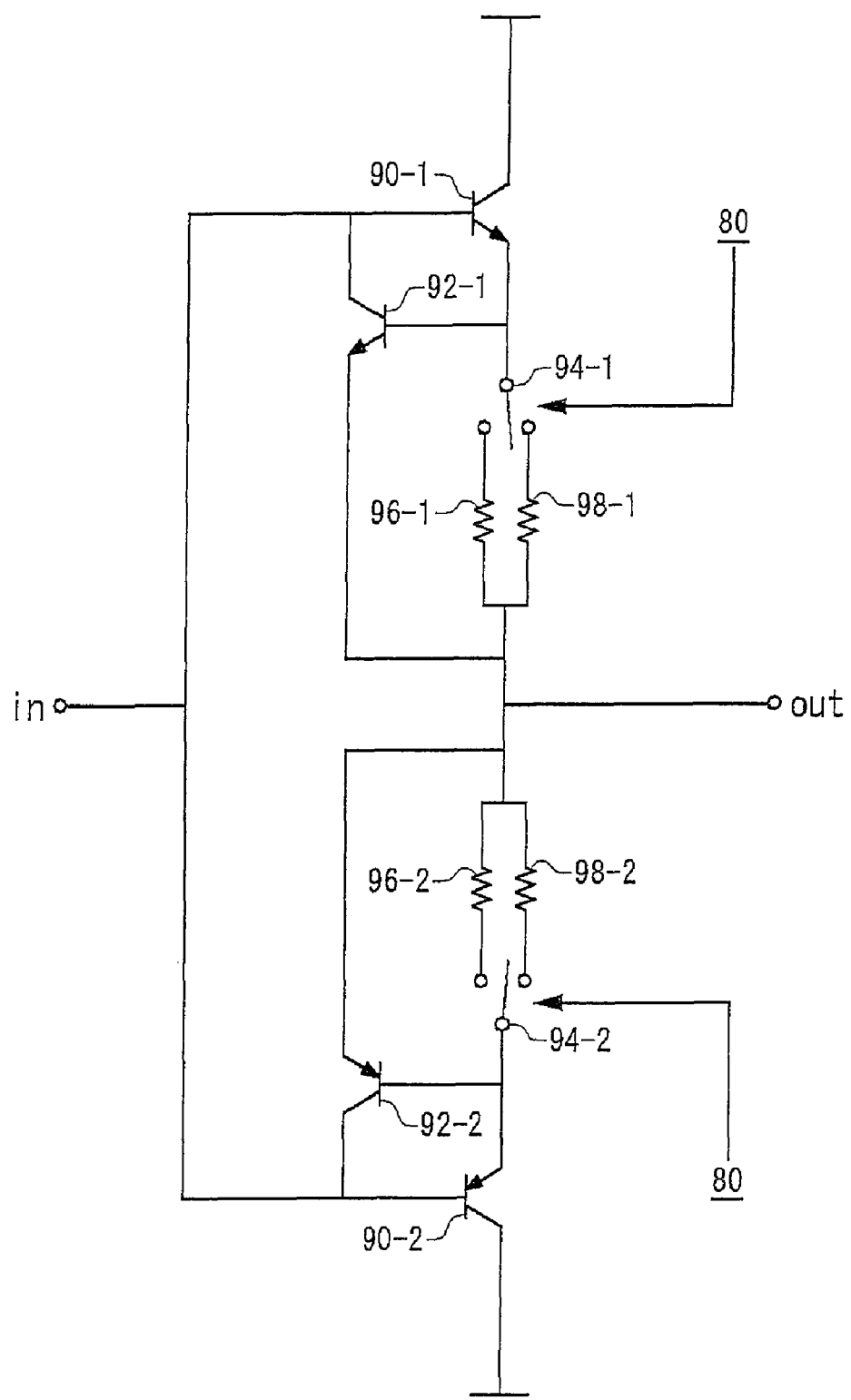
FIG. 7 shows an exemplary configuration of the amplifier circuit 42 in the voltage amplifying section 40.

FIG. 7 shows an exemplary configuration of the amplifier circuit 42 in the voltage amplifying section 40. The amplifier circuit 42 may have an adjustable tracking speed. The amplifier circuit 42 of the present embodiment has a source-side output transistor 90-1, a sink-side output transistor 90-2, a source-side limiting transistor 92-1, a sink-side limiting transistor 92-2, a source-side switch 94-1, a sink-side switch 94-2, a source-side first resistor 96-1, a source-side second resistor 98-1 a sink-side first resistor 96-2, and a sink-side second resistor 98-2.

The source-side output transistor 90-1 is turned on when the input voltage is H level to supply the electronic device 300 with a source current. The sink-side transistor 90-2 is turned on when the input voltage is L level to draw a sink current from the electronic device 300.

The source-side first resistor 96-1 and the source-side second resistor 98-1 have resistances that are different from each other, and are provided in parallel between the source-side output transistor 90-1 and the output terminal. The source-side switch 94-1 switches whether the source-side first resistor 96-1 or the source-side second resistor 98-1 is connected between the source-side output transistor 90-1 and the output terminal. The sink-side switch 94-2 switches whether the sink-side first resistor 96-2 or the sink-side second resistor 98-2 is connected between the sink-side output transistor 90-2 and the output terminal.

The source-side limiting transistor 92-1 designates an upper limit of the source current. The source-side limiting transistor 92-1 of the present embodiment has a base terminal that is connected to an emitter terminal of the source-side output transistor 90, a collector terminal that is connected to a base terminal of the source-side output transistor 90, and a collector terminal that is connected to the output terminal. With this configuration, a voltage caused by the source current flowing though the source-side first resistor 96-1 or the source-side second resistor 98-1 can be applied to the base-emitter junction of the source-side limiting transistor 92-1. When the source current is greater than or equal to a prescribed value, the source-side limiting transistor 92-1 is turned on to restrict the source current. The sink-side limiting transistor 92-2 designates an upper limit of the sink current in the same manner.

The frequency characteristic adjusting section 80 may adjust the upper limits of the source current and the sink current in the voltage amplifying section 40 by controlling the source-side switch 94-1 and the sink-side switch 94-2. By doing this, the frequency characteristic adjusting section 80 can adjust the tracking speed of the voltage amplifying section 40.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The power supply circuit described above can shorten the time that excessive current flows to the electronic device 300, thereby protecting the electronic device 300.

What is claimed is:

1. A power supply circuit that supplies an electronic device with a supply power, comprising:
    a voltage control section that outputs a control voltage tracking an input voltage with a prescribed frequency characteristic and applies a voltage corresponding to the control voltage to the electronic device;
    a voltage adjusting section that detects the voltage applied to the electronic device and adjusts the input voltage based on the detected voltage;
    a current adjusting section that detects a current applied to the electronic device and adjusts the input voltage when the detected current is outside of a prescribed limit range; and
    a frequency characteristic adjusting section that increases a speed at which the control voltage tracks the input voltage by adjusting the frequency characteristic of the voltage control section when the applied current is outside of the limit range;
    wherein the voltage control section comprises:
        a control voltage output section including first input, second input, and output terminals, the first input terminal receiving the input voltage, and the output terminal outputting the control voltage based on a voltage received by the second input terminal and the input voltage; and
        a feedback section that feeds the control voltage output by the control voltage output section back to the second input terminal, and the frequency characteristic adjusting section reduces a time constant of the feedback section when the applied current is outside of the limit rang;
    wherein the feedback section includes:
        a feedback circuit that connects the second input terminal and the output terminal of the control voltage output section to each other;
        a capacitor section that is serially provided on the feedback circuit between the second input terminal and the output terminal of the control voltage output section; and
        a resistance section that is provided between the feedback circuit and a ground potential, and
        the frequency characteristic adjusting section reduces at least one of a resistance of the resistance section and a capacitance of the capacitor section when the applied current is outside of the limit range.

2. The power supply circuit according to claim 1, wherein the resistance section includes:
    a first resistor that is provided between the feedback circuit and the ground potential;
    a second resistor that is provided between the feedback circuit and the ground potential in parallel with the first resistor; and
    a switching section that switches whether the first resistor is connected in parallel with the second resistor, and the frequency characteristic adjusting section connects the first resistor in parallel with the second resistor when the applied current is outside of the limit range and cuts off the second resistor from the first resistor when the applied current is within the limit range.

3. The power supply circuit according to claim 1, wherein the resistance section includes:
    a first resistor that is provided between the feedback circuit and the ground potential;
    a second resistor that is provided between the feedback circuit and the ground potential in parallel with the first resistor and that has a greater resistance than the first resistor; and
    a switching section that switches whether the first resistor or the second resistor is connected to the feedback circuit and the ground potential, and the frequency characteristic adjusting section connects the second resistor between the feedback circuit and the ground potential when the applied current is outside of the limit range and connects the first resistor between the feedback circuit and the ground potential when the applied current is within the limit range.

4. The power supply circuit according to claim 1, wherein the capacitor section includes:
    a first capacitor that is provided on the feedback circuit;
    a second capacitor that is provided in parallel with the first capacitor; and
    a switching section that switches whether the second capacitor is connected in parallel with the first capacitor, and
    the frequency characteristic adjusting section cuts off the second capacitor from the first capacitor when the applied current is outside of the limit range and connects the second capacitor in parallel with the first capacitor when the applied current is within the limit range.

5. The power supply circuit according to claim 1, wherein the capacitor section includes:
    a first capacitor that is provided on the feedback circuit;
    a second capacitor that is provided in parallel with the first capacitor and that has a larger capacitance than the first capacitor; and
    a switching section that switches whether the first capacitor or the second capacitor is connected between the second input terminal and the output terminal of the control voltage output section, and the frequency characteristic adjusting section connects the second capacitor between the second input terminal and the output terminal when the applied current is outside of the limit range and connects the first capacitor between the second input terminal and the output terminal when the applied current is within the limit range.

6. A power supply circuit that supplies an electronic device with a supply power, comprising:
   a voltage control section that outputs a control voltage tracking an input voltage with a prescribed frequency characteristic and applies a voltage corresponding to the control voltage to the electronic device;
   a voltage adjusting section that detects the voltage applied to the electronic device and adjusts the input voltage based on the detected voltage;
   a current adjusting section that detects a current applied to the electronic device and adjusts the input voltage when the detected current is outside of a prescribed limit range;
   a frequency characteristic adjusting section that increases a speed at which the control voltage tracks the input voltage by adjusting the frequency characteristic of the voltage control section when the applied current is outside of the limit range; and
   a voltage amplifying section that has a tracking speed greater than the tracking speed of the voltage control section when the frequency characteristic adjusting section does not adjust the frequency characteristic, and that amplifies the control voltage output by the voltage control section and supplies the electronic device with the amplified voltage, wherein the frequency characteristic adjusting section adjusts the tracking speed of the voltage control section to be substantially equal to the tracking speed of the voltage amplifying section when the applied current is outside of the limit range.

7. The power supply circuit according to claim 6, wherein the frequency characteristic adjusting section increases the tracking speed of the voltage amplifying section by adjusting the frequency characteristic of the voltage amplifying section when the applied current is outside of the limit range, and adjusts the tracking speed of the voltage control section to be substantially equal to the tracking speed of the voltage amplifying section after the frequency characteristic of the voltage amplifying section has been adjusted.

* * * * *